(12) United States Patent
Swarbrick et al.

(10) Patent No.: US 7,290,162 B2
(45) Date of Patent: Oct. 30, 2007

(54) CLOCK DISTRIBUTION SYSTEM

(75) Inventors: Ian Swarbrick, Sunnyvale, CA (US); David Williams, Emersons Green (GB)

(73) Assignee: Clearspeed Solutions Limited, Bristol (GB)

( * ) Notice: Subject to any disclaimer, the term of this patent is extended or adjusted under 35 U.S.C. 154(b) by 145 days.

(21) Appl. No.: 10/468,168

(22) PCT Filed: Feb. 14, 2002

(86) PCT No.: PCT/GB02/00668

§ 371 (c)(1),
(2), (4) Date: Feb. 11, 2004

(87) PCT Pub. No.: WO02/065259

PCT Pub. Date: Aug. 22, 2002

(65) Prior Publication Data

US 2004/0130367 A1    Jul. 8, 2004

(30) Foreign Application Priority Data

| Feb. 14, 2001 | (GB) | ................... | 0103678.9 |
| Feb. 14, 2001 | (GB) | ................... | 0103687.0 |
| Sep. 10, 2001 | (GB) | ................... | 0121790.0 |

(51) Int. Cl.
*G06F 1/00* (2006.01)
*G06F 9/45* (2006.01)

(52) U.S. Cl. .......................... 713/500; 716/6

(58) Field of Classification Search ............... 713/500, 713/400; 716/6
See application file for complete search history.

(56) References Cited

U.S. PATENT DOCUMENTS

| 5,122,679 | A  |   | 6/1992  | Ishii et al. ................ 307/269 |
| 5,398,262 | A  | * | 3/1995  | Ahuja ........................ 375/356 |
| 5,822,779 | A  | * | 10/1998 | Intrater et al. ............. 711/168 |
| 5,828,870 | A  | * | 10/1998 | Gunadisastra ............. 713/503 |
| 5,969,559 | A  | * | 10/1999 | Schwartz .................... 327/295 |
| 6,218,861 | B1 | * | 4/2001  | Sudo et al. ................. 326/46 |
| 6,240,524 | B1 | * | 5/2001  | Suzuki ....................... 713/500 |
| 6,305,001 | B1 | * | 10/2001 | Graef ......................... 716/12 |

FOREIGN PATENT DOCUMENTS

EP    0 903 660 A1    3/1999

\* cited by examiner

*Primary Examiner*—Chun Cao
*Assistant Examiner*—Ji H Bae
(74) *Attorney, Agent, or Firm*—Michael A. Glenn; Glenn Patent Group

(57) ABSTRACT

A clock distribution system for an integrated circuit comprising a plurality of regions (1, 2, 3) connected by a communications bus (12). Each region comprises a functional block (10a, 10b, 10c) and at least one bus node (14a, 14b, 14c) for connecting a respective functional block to the communications bus (12). A distributed clock signal (16) is allowed to skew between regions, but synchronised within respective regions. A predetermined clock insertion delay (20a, 20b, 20c, 22a, 22b, 22c) is inserted in each functional block and bus node.

20 Claims, 8 Drawing Sheets

CLOCK DISTRIBUTION SYSTEM

FIELD OF THE INVENTION

The invention relates to a clock distribution system, and in particular, to a clock distribution system for an integrated circuit.

BACKGROUND OF THE INVENTION

Integrated circuits require a clocking scheme in order to execute instructions and transfer data between functional blocks on the integrated circuit in a synchronised manner. The aim of conventional integrated circuits is for the clock signals to arrive at every circuit element or module simultaneously, so that the circuit elements operate in synchronism. Integrated circuits are therefore typically designed so that the clock signal is distributed in a symmetrical manner across the chip from a centrally located clock reference.

Despite the symmetry associated with prior art clock distribution schemes, imperfections in circuit conductors and variations introduced in the manufacturing process introduce clock skew between circuit elements or modules.

Existing development tools for designing integrated circuits have an automated process for distributing a balanced clock across a chip, so that each of the functional units on the chip operate in synchronism. The automated process for balancing the clock involves a two-stage process. Firstly, a clock tree is inserted into each functional block. Each block has a different insertion delay. Once the functional blocks are placed on the layout floorplan, the second stage of the process involves balancing the clock tree in order to reduce clock skew to within acceptable limits. This involves inserting additional buffers in each path to balance the skew at all clock inputs to every register on the chip. Using this technique the clock tree can be balanced to within 200-300 ps.

The conventional process described above has a number of drawbacks. For example, although the task of inserting the clock buffers into each path to the functional units is relatively automated, the second stage of the process requires more manual intervention, i.e. the tools must be directed as to where the additional clock buffers are to be inserted. This process is time consuming and it is difficult to determine whether the clock skew is within the acceptable tolerance levels. The constant desire to increase clock frequencies means that the problems mentioned above become even more relevant. As a consequence, it becomes difficult to simulate a large integrated circuit within a reasonable time-frame.

The balanced clock tree described above is a standard part of synchronous design methodology. However, a further disadvantage of this technique is that all registers across the whole chip are updated by the arrival of the clock edge, which results in a massive spike in the current drawn by the chip. This current surge is undesirable from a number of viewpoints. For example, the current surges cause unwanted electromagnetic emissions and can also lead to reliability problems due to electromigration failures.

A further disadvantage is that the track sizes have to be larger than necessary to deal with the large current surges. In addition, areas of silicon must be left unused so that the top-level clock drivers can be inserted.

The aim of the present invention is to provide a clock distribution system for an integrated circuit which is tolerable to clock skew, and which simplifies the process of designing large integrated circuits.

SUMMARY OF THE INVENTION

According to a first aspect of the invention, there is provided a cloak distribution system for an integrated circuit comprising a plurality of regions connected by a pipeline communications bus, each region comprising a functional block and at least one bus node for connecting the functional block to the pipeline communications bus, characterized in that a distributed clock signal is allowed to skew between regions, and wherein the clock signal is synchronized within respective regions.

Preferably, the clock signal is distributed to each functional block and bus node, and a predetermined clock insertion delay is inserted in each functional block and bus node.

According to a second aspect of the invention, there is provided a method of distributing a clock signal to a plurality of regions on an integrated circuit, the regions being connected by a pipeline communications bus, each region comprising a functional block and at least one bus node, the method comprising the steps of: allowing the clock to skew between regions on the. integrated circuit; and synchronizing the clock within respective regions on the integrated circuit.

According to a third aspect of the invention, there is provided an integrated circuit comprising a plurality of regions; a bus for connecting the plurality of regions; a clock distribution network configured to route a clock signal to the plurality of regions; characterised in that the clock distribution network is configured to route the clock signal in a synchronised manner within respective regions, and in a skewed manner between respective regions.

According to a fourth aspect of the invention, there is provided a method of reducing peak current in an integrated circuit, the method comprising the steps of partitioning the integrated circuit into a plurality of functional blocks, distributing a clock signal to the respective functional blocks such that at least two functional blocks operate using clock signals which are skewed relative to one another, thereby reducing peak power in the integrated circuit.

According to a fifth aspect of the invention, there is provided a method of designing an integrated circuit, the method comprising the steps of: partitioning the integrated circuit into a plurality of regions, each region having a functional block and at least one bus node; connecting the regions using a communications bus; distributing a clock signal to the respective functional blocks alongside the communications bus; and assigning a predetermined clock insertion delay to each functional block and bus node.

DETAILED DESCRIPTION OF A PREFERRED EMBODIMENT OF THE INVENTION

Figure 1A:
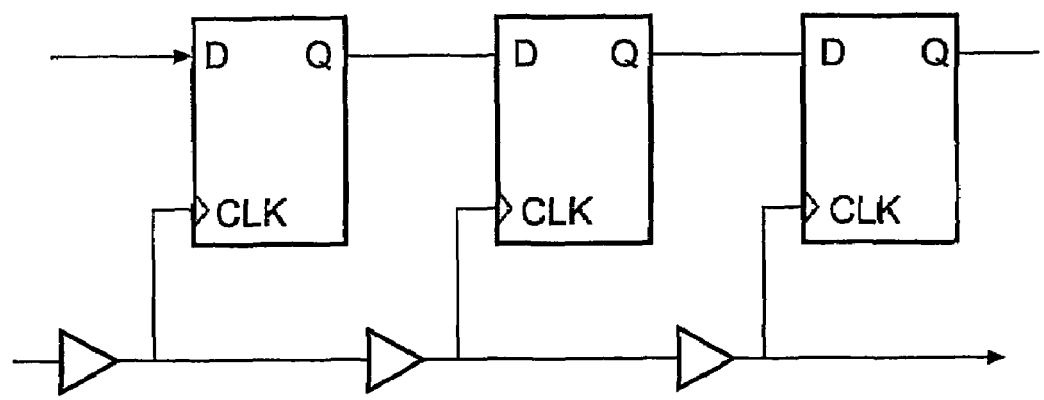
FIGS. 1A and 1B illustrate the problems associated with clock skew.
Figure 1B:
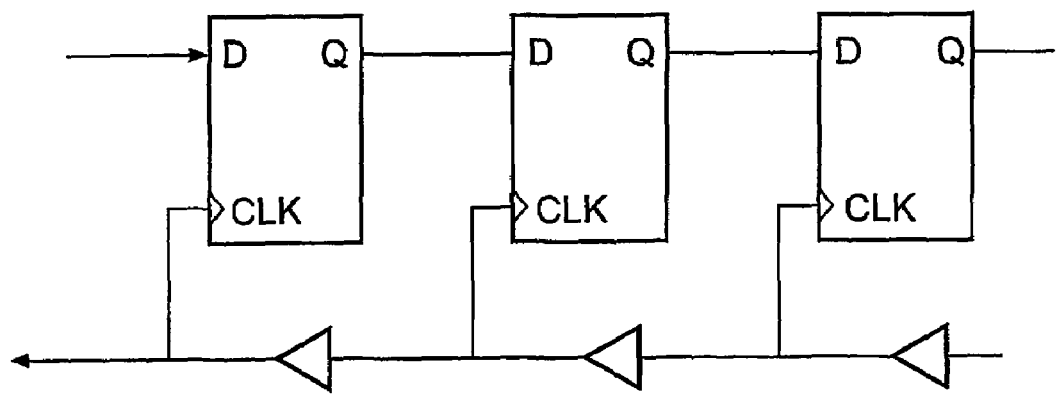

FIGS. 1A and 1B illustrate an example of one of the problems associated with clock skew in an integrated circuit. When the clock signal 1 is travelling in the same direction as the data signal 3 as shown in FIG. 1A, this results in positive skew and can lead to hold-time problems. When the clock signal 1 is travelling in an opposite direction to the data signal 3, as shown in FIG. 1B, this results in negative skew. Although there are no hold-time problems associated with negative skew, it has the drawback of reducing the effective clock period.

There is therefore the danger that, when data is travelling in the same direction as the clock signal, there is a possibility that the data may arrive at the next register in time to cause a hold violation. To eliminate this risk, conventional techniques aim to ensure that there is enough logic delay between registers to prevent this problem.

Figure 2:
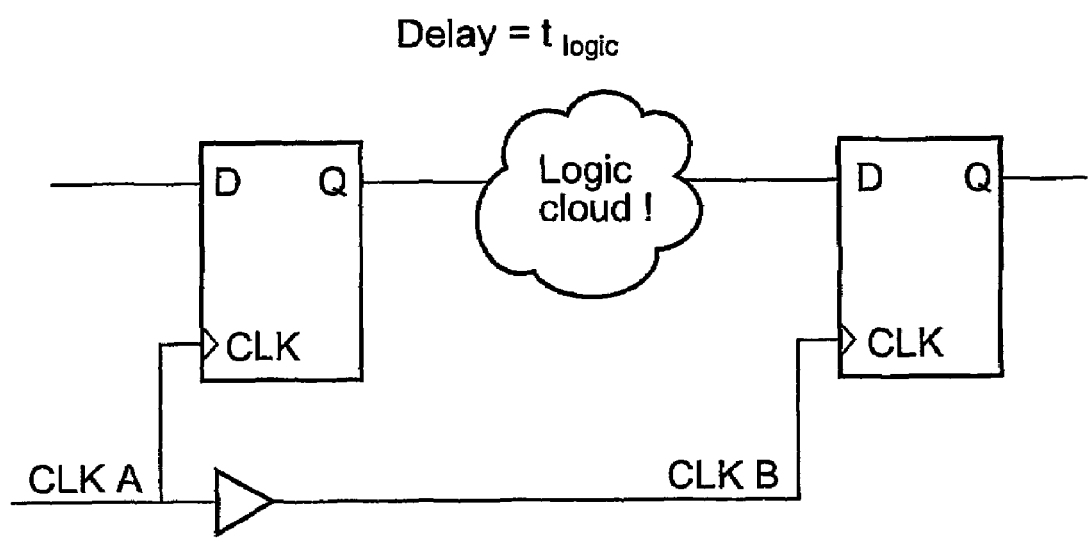
FIG. 2 shows the potential hold-time violation due to clock skew.

FIG. 2 illustrates the problem in greater detail. The data is travelling in the same direction as that in which the clock is being distributed. For the circuit to work:

$$T_{clk-Q}+t_{logic}-t_{hold}>t_{skew}$$

For reliable operation, the worst case (i.e. highest) value of $t_{skew}$ must be known, as well as the values of $T_{clk-Q}$ and $t_{logic}$ under "fast" conditions. The maximum value for $t_{hold}$ should be used.

This approach assumes that clock skew is simply tolerated and is masked by logic delay. To cope with the skews between clock signals distributed to different registers within the same functional block, it is common practice to provide a clock uncertainty figure to the logic synthesis software. The design tools will then look for potential hold-time violations and make sure that there is enough logic delay to prevent this from happening.

Figure 3:
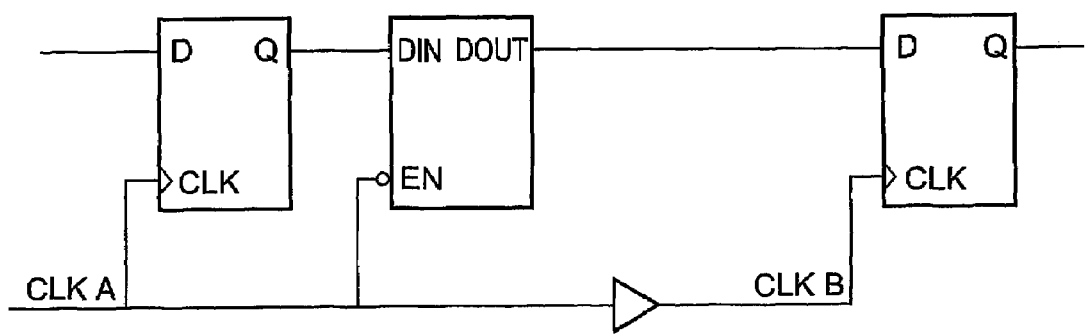
FIG. 3 shows a conventional method of compensating for clock skew.

Although this technique is tolerable for intra functional block clock distribution, it is necessary to insert a large-amount of logic to tolerate larger skews. A known method of overcoming this problem is to use half-latches as shown in FIG. 3. When a positive edge of clock A occurs, the latch closes (i.e. is opaque). This prevents the data from overtaking the clock signal and causing a hold-violation. This technique can be used to cover up to one-half clock cycle of skew.

Figure 4:
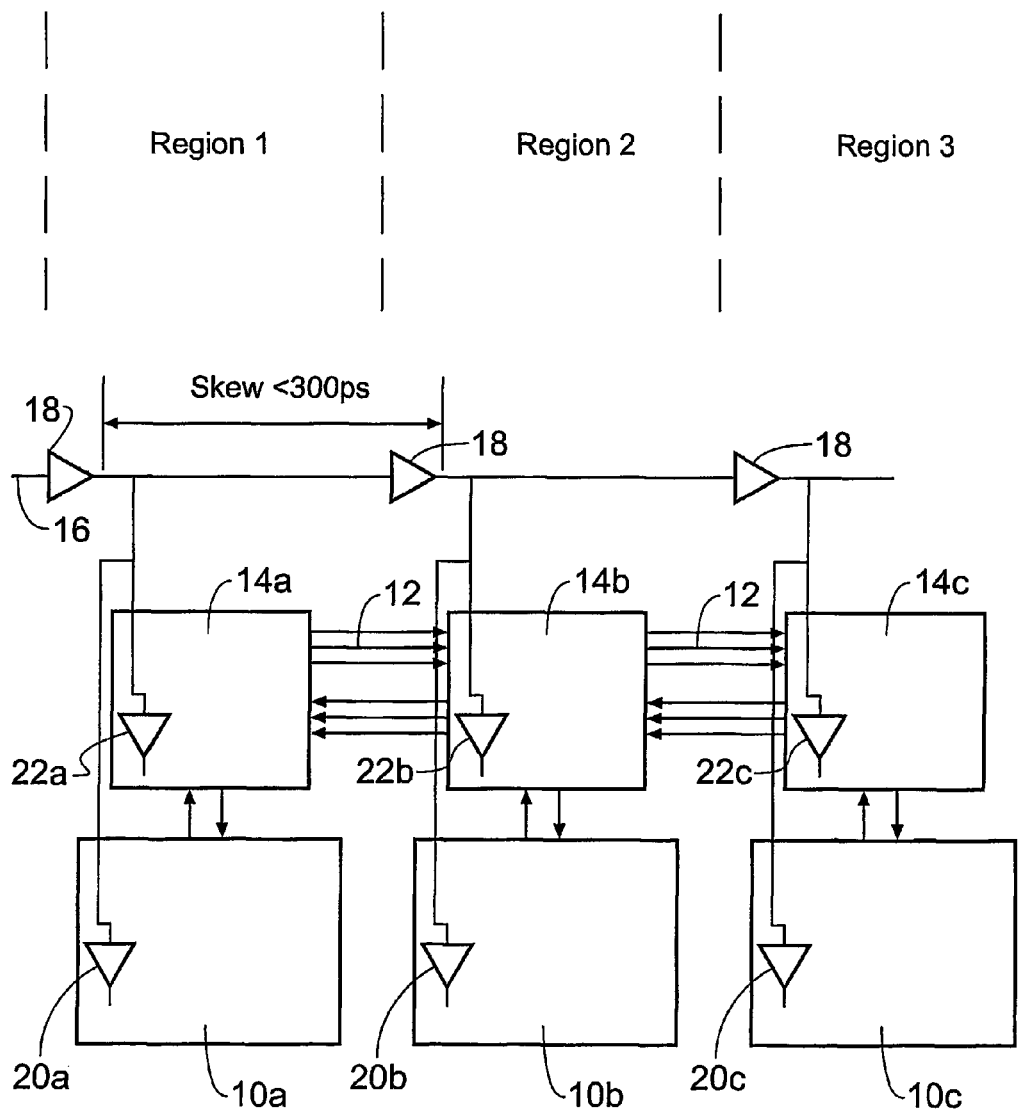
FIG. 4 shows a clock distribution system according to a first embodiment of the present invention.

FIG. 4 shows a clock distribution system according to a first aspect of the present invention. A plurality of functional blocks 10a, 10b, 10c are interconnected by a communication bus 12. Preferably the bus is a pipelined bus. It is noted that the term "functional block" is taken to mean a virtual processing block, for example one of a plurality of reusable on-chip functional blocks or virtual component blocks. The functional blocks are sometimes referred to as "System on Chip" blocks. Each functional block 10a, 10b, 10c is connected to the communication bus 12 by a respective bus node 14a, 14b, 14c. The functional blocks 10a, 10b, 10c communicate with one another via the bus nodes 14a, 14b, 14c and communication bus 12. The bus nodes 14a, 14b, 14c act as the interface between the functional blocks 10a, 10b, 10c and the bus 12, and deal with, for example, the handling of address decoding and protocol translation.

According to the present invention, a clock signal 16 is connected to the various functional blocks 10a, 10b, 10c, preferably alongside the communications bus 12, allowing the clock signal 16 to skew as it travels between functional blocks. The skew is schematically represented in FIG. 4 by delay elements 18.

Each functional block 10a, 10b, 10c is provided with a clock insertion delay 20a, 20b, 20c, respectively. Likewise, each bus node 14a, 14b, 14c is also provided with a clock insertion delay 22a, 22b, 22c. Preferably, the clock insertion delay 20a of functional block 10a is assigned a value which is substantially equal to the clock insertion delay 22a of bus node 14a. For example, if the skew between adjacent functional blocks 10a and 10b is known to be less than 300 ps, a delay of 3.4 ns can be chosen as the clock insertion delay for functional block 10a and bus node 14a. This means that functional block 10a is synchronised with its respective bus node 14a.

Likewise, the clock insertion delay 20b of functional block 10b is assigned a clock insertion delay substantially equal to the clock insertion delay 22b of bus node 14b. The clock insertion delay 20c of functional block 10c is assigned a clock insertion delay substantially equal to the clock insertion delay 22c of bus node 14c.

Preferably, the clock insertion delays 20a, 20b, 20c of functional blocks 10a, 10b and 10c, and the clock insertion delays 22a, 22b, 22c of bus nodes 14a, 14b, 14c will be assigned the same clock insertion delay.

Alternatively, whereas each functional block and associated bus node is assigned the same clock insertion delay, a separate functional block and its associated bus node may be assigned a clock insertion delay which is a multiple of the clock period plus the insertion delay. For example, if the clock period is 2.5 ns and the insertion delay of functional block 10a is 3.4 ns, then the clock insertion delay of other blocks can be assigned clock insertion delays of:

N×2.5 ns+3.4 ns where n is a positive integer greater than, or equal to zero.

In other words, other nodes may be clocked by a clock signal which, in real time, is several clock cycles downstream of the clock signal being used to clock a first functional block, provided the clock edge at the other nodes is synchronised to within acceptable limits of the clock edge at the first functional block. The bus nodes are skewed relative to their neighbours by some amount, for example less than 300 ps (being the time taken for a signal to propagate approximately 1 mm). It is noted that the skew between a first pair of nodes can vary in relation to the skew between a second pair of nodes. The skew is dealt with by setting the clock uncertainty to be greater than, for example, 300 ps for all signals between bus nodes. Thus, although the clock at functional block 10c is skewed by 600 ps relative to the clock at functional block 10a, this does not affect the operation of the circuit provided that the clock uncertainty is set to be greater than 300 ps, since each functional block 10a and 10c is in synchronisation with respect to its own bus node 14a, 14c. Setting the clock uncertainty involves providing a synthesis tool the information so that it can calculate the worst case timing relationships between two clock edges, with the appropriate timings being used to direct the synthesis of logic such that setup and hold times are not violated.

Figure 5:
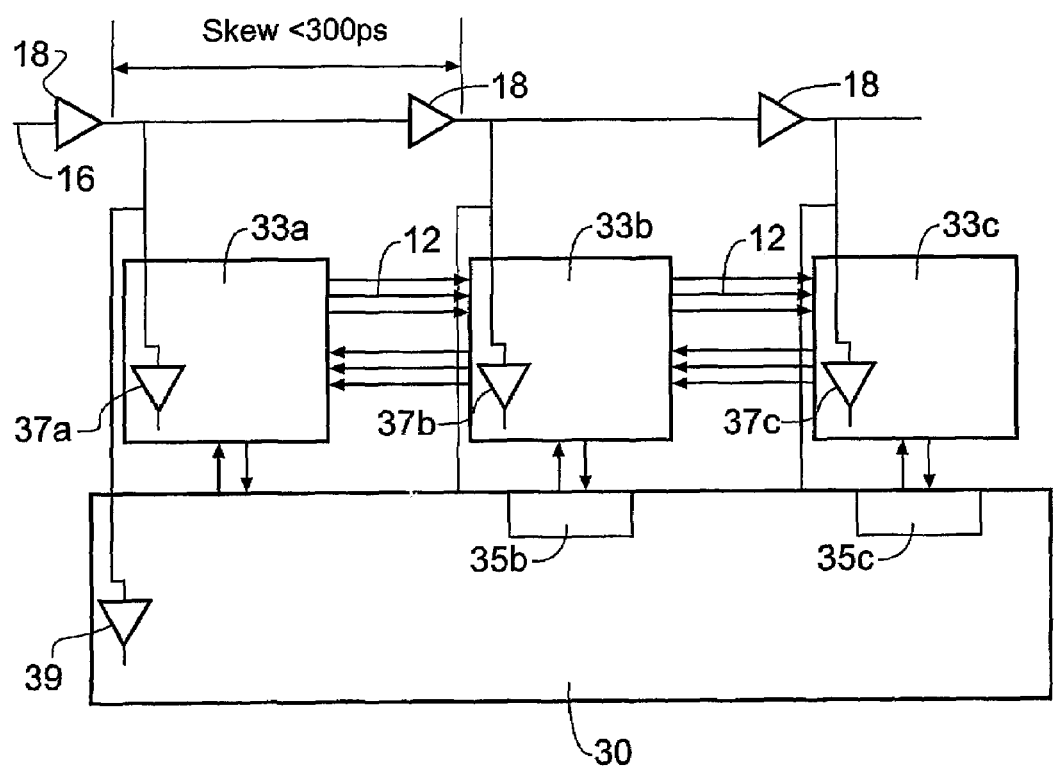
FIG. 5 shows a clock distribution system according to a second embodiment of the present invention.

FIG. 5 shows an example of a clock distribution system in accordance with a second aspect of the present invention. Whereas the functional blocks 10a, 10b, 10c in FIG. 4 were relatively small so that only one bus node 14a, 14b, 14c was required per functional block, the circuit of FIG. 5 shows a larger functional block 30 which has a plurality of interfaces to the communications bus via a plurality of bus nodes 33a, 33b, 33c.

As above, the clock signal 16 is distributed to the functional block 30 and each of the bus nodes 33a, 33b, 33c, preferably alongside the bus 12. The functional block 30 is assigned a clock insertion delay 39 which is substantially equal to the clock insertion delay 37a assigned to the bus node 33a. Preferably, the clock insertion delay 37b, 37c of bus nodes 33b, 33c are assigned the same value of clock insertion delay as that of bus node 33a. Alternatively, clock insertion delays 37b, 37c may be multiples of the clock period plus the clock insertion delay 37a, as described above in relation to FIG. 4.

Since the functional block 30 is larger than the functional block 10a of FIG. 4, the clock insertion delay has to be increased accordingly. For example, assuming that the skew between bus nodes 33a/33b and 33b/33c is less than 300 ps, a clock insertion delay of 5.9 ns may be assigned to each of the clock insertion delay means 39, 37a, 37b and 37c. Alternatively, the clock insertion delays 37b and 37c may be multiples of the clock period. The minimum possible insertion delay for a large functional block (such as the functional block 30) will be higher than that for a bus node, so the insertion delay figure chosen must be long enough to accommodate the largest functional block in the system.

Communication between the functional block 30 and respective bus nodes 33b, 33c will be out of phase. The phase relationship between the clock in each block is shown in FIG. 6.

Figure 6:
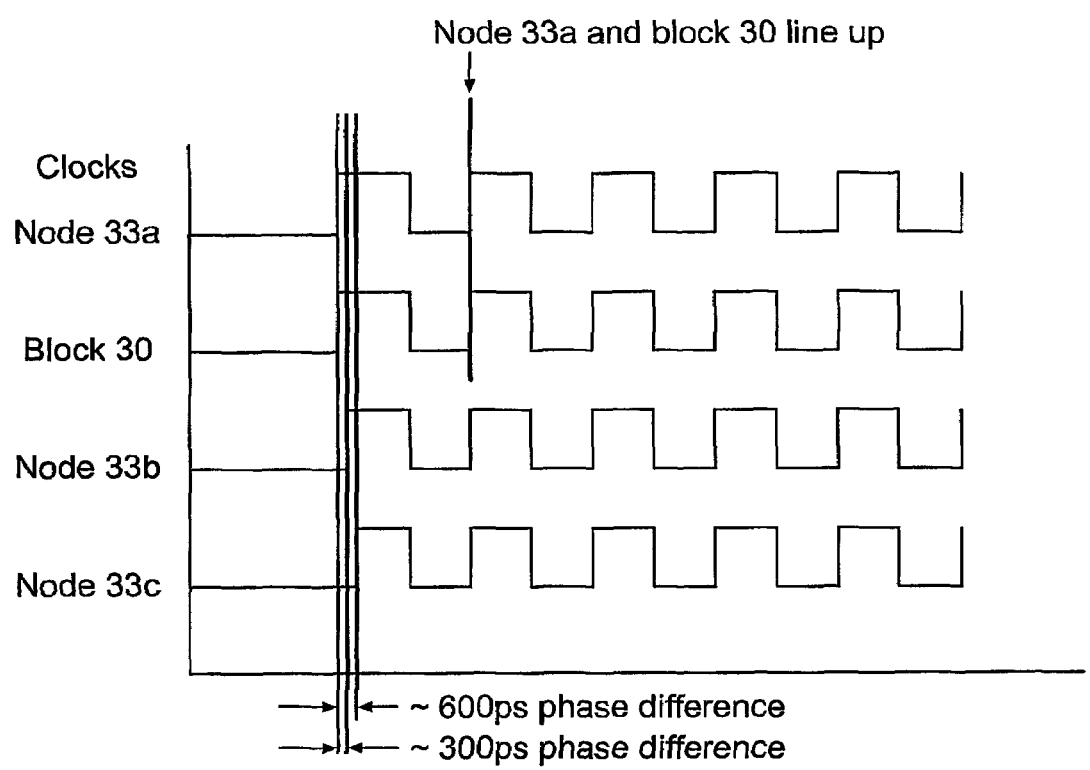
FIG. 6 shows the phase relationship between clock signals in the second embodiment of FIG. 5.

Referring to FIG. 6, it can be seen that the bus node 33a is in synchronism with the functional block 30, because both elements have the same insertion delay. In order to allow multiple bus nodes 33a, 33b, 33c to interface to the same functional block 30, a clock bridge 35b, 35c is provided for the bus nodes 33b and 33c, respectively, which are not in synchronism with the functional block 30. Preferably, the clock bridges 35b and 35c are standard blocks that can be inserted in the circuit design wherever they are needed.

Figure 7:
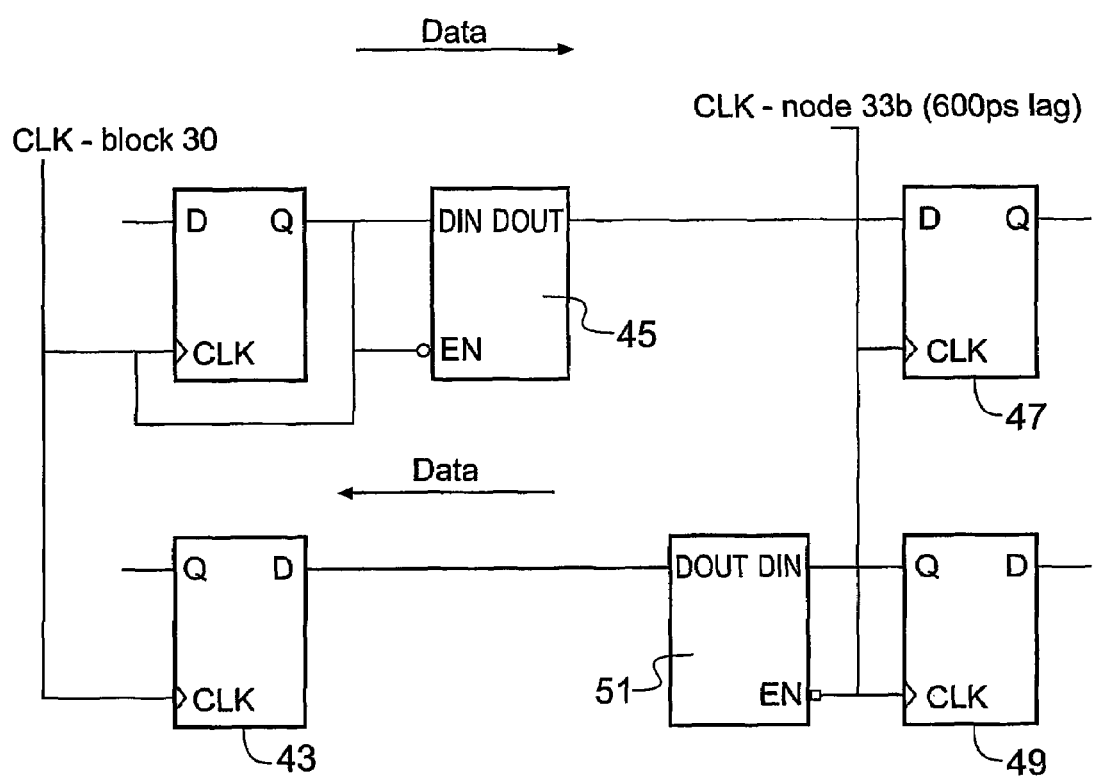
FIG. 7 shows an example of a clock bridge of the second embodiment of FIG. 5.

FIG. 7 shows an example of how the clock bridge 35b, 35c may be implemented. The clock bridge shown is bidirectional, and for simplicity shows a single-bit data path in each direction. It will be appreciated that the same method applies to wider data paths. In this example, the clocks are skewed by 600 ps, but this could be greater, as long as it is less than half of the clock period (with some safety margin). When the clock at functional block 30 is high, the adjacent latch 41 is closed, preventing data D from "shooting through". The latch 43 is not necessary when the data is travelling in the opposite direction (from lagging to leading clock), but it is preferably included so that the unit is symmetrical. This means that the clock bridge will still work when it is connected the wrong way around. In a similar manner, the clock signal from bus node 33b is connected to latches 47, 49 and 51. Latch 51 is opaque when the clock signal from bus node 33b is high, thereby preventing data from "shooting through". The introduction of latches 41, 43, 47, 49 presents problems in the design tool flow, for example in the formal verification. It is difficult to know the designer's intent when latches are used. In the case of the clock bridge, it is one component that can be carefully checked, and is then used throughout the chip.

Alternatively, logic gates can be used to create the necessary delay. However, this approach has the disadvantage of consuming more power, and using more area on the integrated circuit.

The solution proposed so far allows multiple bus nodes to interface to one functional block. The example described in FIG. 5 shows the clock in the functional block 30 being matched with that of the first bus node 33a. Alternatively, the clock in the functional block 30 can be matched with the bus node which is closest to the centre of the functional block 30, i.e. bus node 33b in the example of FIG. 5. This has the advantage of increasing the amount of overall skew that can be tolerated.

The clock distribution system according to the second aspect of the invention as described above has a limit to the amount of skew that can be tolerated. For example, for a very large functional block (e.g. greater than 6-8 mm between interfaces), it will become difficult to manage the clock skew. Furthermore, the additional of clock bridges 35b and 35c adds cycles of clock latency at the bus interfaces.

Figure 8:
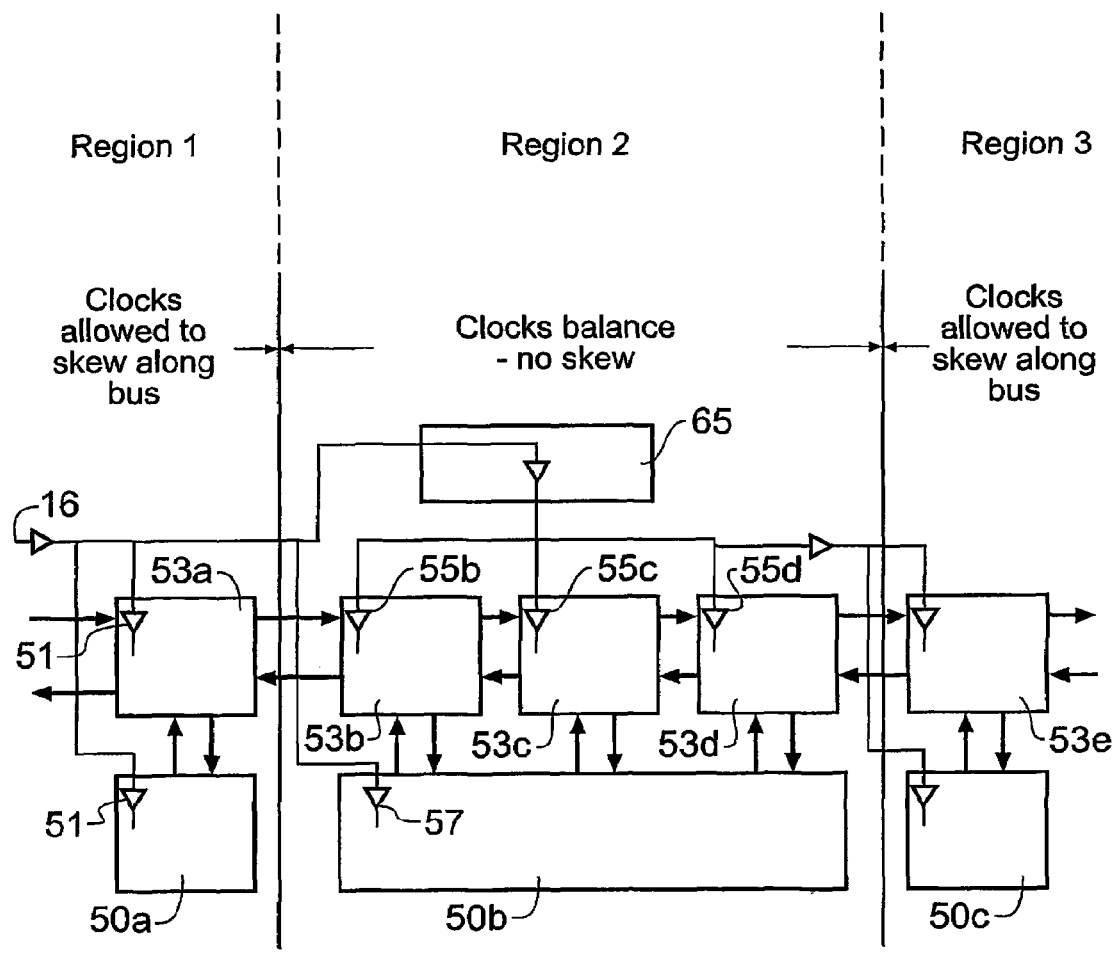
FIG. 8 shows a clock distribution system according to a third embodiment of the present invention.

FIG. 8 shows an example of a clock distribution system according to the third aspect of the invention. The clock is allowed to skew in the first region, i.e. in the sections of the integrated circuit where functional blocks 50a, 50c and bus nodes 53a, 53e are located. Functional block 50a has an insertion delay 51 of 5.8 ns which matches the insertion delay 51 of its corresponding bus node 53a, (i.e. which also has an insertion delay of 5.8 ns). Similarly, functional block 50c has an insertion delay of 5.8 ns which matches the insertion delay of its corresponding bus node 53e.

Instead of using clock bridges between the bus nodes 53c/53d and the functional block 50b, this embodiment uses top-level insertion to balance the bus nodes 53b, 53c, 53d belonging to the functional block 50b. For example, if functional block 50b has an insertion delay 57 of 5.8 ns, the bus nodes 53b, 53c, 53d are arranged to have insertion delays of 3.3 ns (shown as 55b, 55c, 55d). Synchronisation between each of the bus nodes 53b, 53c, 53d and the functional block 50b is achieved by top-level insertion of a delay buffer 65 providing an insertion delay of 2.5 ns. The 2.5 ns delay of buffer 65 combines with the insertion delay of 3.3 ns in each of the bus nodes 53b, 53c, 53d to achieve an effective insertion delay of 5.8 ns, i.e. corresponding to that of the functional block 30b. It is noted that, in the example provided above, the clock insertion delay of buffer 65 matches the clock period, i.e. 2.5 ns. Thus, when bus node 55d talks to bus node 55e the difference between them is the relative clock skew, (closest clock edges being compared rather than the absolute clock edges).

Thus, the clock distribution system within this area of the integrated circuit uses the conventional "tree" method. The clock is still allowed to skew as it travels alongside the bus, until it reaches a large functional block 50b. The bus nodes 53b, 53c, 53d connected to the functional block 50b have balanced clocks (less than 100 ps). The clock signal that is distributed downstream from this segment is then allowed to start skewing again. According to this embodiment, space needs to be reserved in the bus nodes connected to functional block 50b, to allow space for the clock buffer 65 that balances the clock into functional block 50b and the clocks into the bus nodes.

According to the third aspect of the invention, the circuit maintains most of the benefit of the improved clock distribution system, in that most of the clock insertion is done in advance, with only minimal balancing needed at the "back-end" for the very large functional blocks, i.e. for functional blocks that are too large to use the skewed method. This embodiment has the advantage of allowing the clock to be smeared so that peak power is reduced, but without having the latency overhead introduced by clock bridges.

It will be appreciated that an integrated circuit may have any combination of solutions disclosed above. For example, one region may have one bus node assigned per functional block, while another region has multiple bus nodes assigned per functional block. Furthermore, where multiple bus nodes are assigned per functional block, the system can choose between the use of the "clock bridge" method described in FIG. 5, or the "balanced tree" method described in FIG. 8, or a combination of both systems on the same integrated circuit.

The embodiments described above enable an integrated circuit to be developed with reduced top-level clocking structures. The bus nodes and functional blocks contain the necessary components to distribute the clock signal, allowing the bus nodes and functional blocks to be connected together in a simple manner, with the clock bridges providing the necessary interfaces. Larger functional blocks are dealt with by providing space in the circuit design for top-level clock structures, but this is a much smaller overhead than balancing the clock tree across an entire chip.

As mentioned earlier, the invention has the advantage of tolerating clock skew, rather than trying to eliminate it. This results in different registers on the chip having different clock edges, thereby smoothing the large current peaks which are normally drawn. As a consequence, power distribution is eased, which allows track sizes to be narrowed. In addition, reduced current density through the metal tracks will improve reliability, particularly with regard to electromigration failures.

A further advantage of the clock distribution system is re-use. The same piece of layout can be re-used across multiple chips, provided they have the same clock frequency and use the same rule for insertion delays.

It is noted that, although the preferred embodiments show the clock insertion delay of a functional node being chosen to be substantially equal to the clock insertion delay of its corresponding bus node, these clock insertion delays can also be offset in the manner described above in relation to the various functional blocks, i.e. whereby a clock insertion delay is offset from a first clock insertion delay by +/−N clock periods, where N is zero or a positive integer, plus the clock insertion delay.

The invention claimed is:

1. A clock distribution system for an integrated circuit comprising a plurality of regions connected by a pipeline communications bus, each region comprising a functional block and at least one bus node for connecting the functional block to the pipeline communications bus, characterised in that a distributed clock signal is allowed to skew between regions, wherein the clock signal is synchronized within respective region, and wherein at least one region has two or more bus nodes connected to a functional block, wherein a first of said bus nodes is connected directly to the functional block, and the remaining bus nodes connected to the functional block via a delay device.

2. A clock distribution system as claimed in claim 1, wherein the clock signal is distributed to each functional, block and bus node, and wherein a predetermined clock insertion delay is inserted in each functional block and bus node.

3. A clock distribution system as claimed in, claim 1, wherein the delay device comprises a clock bridge provided between the respective bus node and functional block.

4. A clock distribution system as claimed in claim 3, wherein the clock bridge forms part of the functional block.

5. A clock distribution system as claimed in claim 1, wherein the first bus node is connected to a central portion of the functional block.

6. A clock distribution system as claimed in claim 2, wherein the clock insertion delay of each functional block and bus node is substantially equal.

7. A clock distribution system as claimed in claim 2, wherein the clock insertion delay of one functional block or bus node is offset by a predetermined amount from the clock insertion delay of another functional block or bus node.

8. A clock distribution system as claimed in claim 2, wherein the clock insertion delay is chosen in accordance with the size of the largest functional block connected to the communications bus.

9. A clock distribution system as claimed in claim 1, wherein at least one of the regions has two or more bus nodes (53b, 53c, 53d) connected to a functional block (50b), each of said bus nodes (53b, 53c, 53d) having a substantially equal clock insertion delay (55b, 55c, 55d), the clock insertion delay (55b, 55c, 55d) of the bus nodes being different to the clock insertion delay (57) of the functional block (50b), and wherein the clock signal within the region is routed to each of said bus nodes (53b, 53c, 53d) via, a delay buffer (65).

10. A clock distribution system as claimed in claim 9, wherein the clock insertion delay of the functional block (50b) is substantially equal to the sum of the delay provided by the delay buffer (65) and the clock insertion delay (55b, 55c, 55d) provided by a respective bus node.

11. A method of distributing a clock signal to a plurality of regions on an integrated circuit, the regions being connected by a pipeline communications bus, each region comprising a functional block and at least one bus node, the method comprising the steps of:
allowing the clock to skew between regions on the integrated circuit;
synchronising the clock within respective regions on the integrated circuit;
connecting two or more bus nodes to a functional block in at least one region; and
arranging the bus nodes in said region such that a first of said bus nodes is connected directly to the functional block, and the remaining bus nodes connected to the functional block via a delay device.

12. A method as claimed in claim 11, wherein the clock signal is distributed to each functional block and bus node, and further comprising the step of inserting a predetermined clock insertion delay in each functional block and bus node.

13. A method as claimed in claim 11, wherein the delay device comprises a clock bridge provided between the respective bus node and functional block.

14. A method as claimed in claim 13, wherein the clock bridge forms part of the functional block.

15. A method as claimed in claim 11, wherein the first bus node is connected to a central position of the functional block.

16. A method as claimed in claim 12, wherein the clock insertion delay of each functional block and bus node is substantially equal.

17. A method as claimed in claim 12, wherein the clock insertion delay of one functional block or bus node is offset by a predetermined amount from the clock insertion delay of another functional block or bus node.

18. A method as claimed in claim 12, wherein the clock insertion delay is chosen in accordance with the size of the largest functional block connected to the communications bus.

19. A method as claimed in claim 11, further comprising the steps of:

connecting two or more bus nodes (53*b*, 53*c*, 53*d*) to a functional block (50*b*) in at least one region, each of said bus nodes (53*b*, 53*c*, 53*d*) having a substantially equal clock insertion delay (55*b*, 55*c*, 55*d*), the clock insertion delay (55*b*, 55*c*, 55*d*) of the bus nodes being different to the clock insertion delay (57) of the functional block (50*b*); and routing the clock signal within said region to each of said bus nodes (53*b*, 53*c*, 53*d*) via a delay buffer (65).

20. A method as claimed in claim 19, wherein the clock insertion delay of the functional block (50*b*) is substantially equal to the sum of the delay provided by the delay buffer (65) and the clock insertion delay (55*b*, 55*c*, 55*d*) provided by a respective bus node.

* * * * *